United States Patent
Kadin

(10) Patent No.: US 8,970,217 B1
(45) Date of Patent: Mar. 3, 2015

(54) SYSTEM AND METHOD FOR NOISE REDUCTION IN MAGNETIC RESONANCE IMAGING

(75) Inventor: Alan M. Kadin, Princeton Junction, NJ (US)

(73) Assignee: Hypres, Inc., Elmsford, NY (US)

( * ) Notice: Subject to any disclaimer, the term of this patent is extended or adjusted under 35 U.S.C. 154(b) by 902 days.

(21) Appl. No.: 13/086,793

(22) Filed: Apr. 14, 2011

Related U.S. Application Data

(60) Provisional application No. 61/324,130, filed on Apr. 14, 2010.

(51) Int. Cl.
*G01R 33/48* (2006.01)
*G01R 33/56* (2006.01)

(52) U.S. Cl.
CPC ..................... *G01R 33/56* (2013.01)
USPC .......................... 324/307; 324/318

(58) Field of Classification Search
CPC ........................................ G01R 33/56
USPC ........................ 324/300–322; 600/407–422
See application file for complete search history.

(56) References Cited

U.S. PATENT DOCUMENTS

| | | | |
|---|---|---|---|
| 3,801,877 A | 4/1974 | Griese et al. | |
| 4,390,840 A | 6/1983 | Ganssen et al. | |
| 4,442,404 A | 4/1984 | Bergmann | |
| 4,573,015 A | 2/1986 | Abe et al. | |
| 4,588,947 A | 5/1986 | Ketchen | |
| 4,695,801 A | 9/1987 | Arakawa et al. | |
| 4,769,605 A | 9/1988 | Fox | |
| 4,851,777 A | 7/1989 | Macovski | |
| 4,864,237 A | 9/1989 | Hoenig | |
| 4,879,516 A | 11/1989 | Mehdizadeh et al. | |
| 4,906,931 A | 3/1990 | Sepponen | |
| 4,951,674 A | 8/1990 | Zanakis et al. | |
| 4,987,368 A | 1/1991 | Vinegar | |
| 5,021,739 A | 6/1991 | Yokosawa et al. | |
| 5,057,776 A | 10/1991 | Macovski | |

(Continued)

OTHER PUBLICATIONS

"Signal-to-noise ratio in MRI", T.W. Redpath, British Journal of Radiology, vol. 71, pp. 704-707 (1998).

(Continued)

*Primary Examiner* — Melissa Koval
*Assistant Examiner* — Rishi Patel
(74) *Attorney, Agent, or Firm* — Steven M. Hoffberg; Ostrolenk Faber LLP

(57) ABSTRACT

Signals of interest in magnetic resonance imaging (MRI) systems comprise narrowband, circularly polarized (CP) radio-frequency magnetic fields from rotating atomic nuclei. Background "body noise" may comprise broadband, linearly polarized (LP) magnetic fields from thermally-activated eddy currents, and may exceed the signal in a band of interest, limiting the imaging resolution and requiring excessive averaging times. Noise may be selectively detected and substantially suppressed, while enhancing the signal of interest, using appropriate digital time-domain algorithms. At least two quadrature receiving antennas may be employed to distinguish and separate the LP noise from the CP signal. At least one broadband receiver may be used to identify and localize fast noise sources and to digitally filter the representation of their radio-frequency magnetic fields in the signal. Selective body noise reduction may allow enhanced signal-to-noise ratio of the system, leading to improved imaging resolution and shorter scan time.

31 Claims, 7 Drawing Sheets

(56) References Cited

U.S. PATENT DOCUMENTS

| | | |
|---|---|---|
| 5,140,324 A | 8/1992 | Przybysz et al. |
| 5,170,080 A | 12/1992 | Murphy et al. |
| 5,187,327 A | 2/1993 | Ohta et al. |
| 5,198,815 A | 3/1993 | Przybysz et al. |
| 5,208,533 A | 5/1993 | Le Roux |
| 5,208,534 A | 5/1993 | Okamoto et al. |
| 5,233,992 A | 8/1993 | Holt et al. |
| 5,254,950 A | 10/1993 | Fan et al. |
| 5,274,331 A | 12/1993 | Macovski |
| 5,276,398 A | 1/1994 | Withers et al. |
| 5,289,400 A | 2/1994 | Przybysz et al. |
| 5,300,887 A | 4/1994 | Macovski |
| 5,303,705 A | 4/1994 | Nenov |
| 5,325,854 A | 7/1994 | Ehnholm |
| 5,326,986 A | 7/1994 | Miller, Jr. et al. |
| 5,339,811 A | 8/1994 | Ohta et al. |
| 5,343,147 A | 8/1994 | Sager et al. |
| 5,347,222 A | 9/1994 | Fox et al. |
| 5,351,006 A | 9/1994 | Sumanaweera et al. |
| 5,384,109 A | 1/1995 | Klaveness et al. |
| 5,408,178 A | 4/1995 | Wikswo, Jr. et al. |
| 5,426,365 A | 6/1995 | Sekihara et al. |
| 5,436,564 A | 7/1995 | Kreger et al. |
| 5,442,290 A | 8/1995 | Crooks |
| 5,495,849 A | 3/1996 | Hayashi et al. |
| 5,543,770 A | 8/1996 | Sasaki et al. |
| 5,557,199 A | 9/1996 | Bowman et al. |
| 5,586,064 A | 12/1996 | Grupp |
| 5,594,849 A | 1/1997 | Kuc et al. |
| 5,600,243 A | 2/1997 | Colclough |
| 5,601,081 A | 2/1997 | Tomita et al. |
| 5,608,320 A | 3/1997 | Dinsmore et al. |
| 5,657,756 A | 8/1997 | Vrba et al. |
| 5,671,740 A | 9/1997 | Tomita et al. |
| 5,682,889 A | 11/1997 | Tomita et al. |
| 5,752,514 A | 5/1998 | Okamura et al. |
| 5,755,227 A | 5/1998 | Tomita et al. |
| 5,771,893 A | 6/1998 | Kassai et al. |
| 5,771,894 A | 6/1998 | Richards et al. |
| 5,793,210 A | 8/1998 | Pla et al. |
| 5,827,501 A | 10/1998 | J.o slashed.rgensen et al. |
| 5,835,995 A | 11/1998 | Macovski et al. |
| 5,982,174 A | 11/1999 | Wagreich et al. |
| 6,002,254 A | 12/1999 | Kassai et al. |
| 6,023,161 A | 2/2000 | Dantsker et al. |
| 6,031,373 A | 2/2000 | Szeles et al. |
| 6,073,040 A | 6/2000 | Kiyuna |
| 6,150,809 A | 11/2000 | Tiernan et al. |
| 6,159,444 A | 12/2000 | Schlenga et al. |
| 6,187,032 B1 | 2/2001 | Ohyu et al. |
| 6,208,884 B1 | 3/2001 | Kumar et al. |
| 6,370,414 B1 | 4/2002 | Robinson |
| 6,374,131 B1 | 4/2002 | Tomita et al. |
| 6,420,873 B1 | 7/2002 | Guthrie |
| 6,477,398 B1 | 11/2002 | Mills |
| 6,522,908 B1 | 2/2003 | Miyashita et al. |
| 6,538,445 B2 | 3/2003 | James et al. |
| 6,544,170 B1 | 4/2003 | Kajihara et al. |
| 6,608,581 B1 | 8/2003 | Semenov |
| 6,636,040 B1 | 10/2003 | Eydelman |
| 6,681,131 B2 | 1/2004 | Kandori et al. |
| 6,697,660 B1 | 2/2004 | Robinson |
| 6,724,188 B2 | 4/2004 | Butters et al. |
| 6,838,875 B2 | 1/2005 | Freedman |
| 6,865,494 B2 | 3/2005 | Duensing et al. |
| 6,885,192 B2 | 4/2005 | Clarke et al. |
| 6,897,654 B2 | 5/2005 | Barbic |
| 7,038,450 B2 | 5/2006 | Romalis et al. |
| 7,053,610 B2 | 5/2006 | Clarke et al. |
| 7,092,748 B2 | 8/2006 | Valdes Sosa et al. |
| 7,116,102 B2 | 10/2006 | Clarke et al. |
| 7,123,952 B2 | 10/2006 | Nakai et al. |
| 7,126,333 B2 | 10/2006 | Beard et al. |
| 7,130,675 B2 | 10/2006 | Ewing et al. |
| 7,144,376 B2 | 12/2006 | Nakai et al. |
| 7,187,169 B2 | 3/2007 | Clarke et al. |
| 7,193,415 B2 | 3/2007 | Barbic et al. |
| 7,197,352 B2 | 3/2007 | Gott et al. |
| 7,218,104 B2 | 5/2007 | Clarke et al. |
| 7,248,044 B2 | 7/2007 | Kobayashi et al. |
| 7,363,070 B2 | 4/2008 | Ogata et al. |
| 7,365,663 B2 | 4/2008 | Rylov et al. |
| 7,395,107 B2 | 7/2008 | Ishiyama et al. |
| 7,443,719 B2 | 10/2008 | Kirichenko et al. |
| 7,466,132 B2 | 12/2008 | Clarke et al. |
| 7,474,095 B2 | 1/2009 | Levitt et al. |
| 7,482,807 B2 | 1/2009 | Gleich et al. |
| 7,521,928 B2 | 4/2009 | Romalis et al. |
| 7,525,314 B1 | 4/2009 | Heiland |
| 7,535,228 B2 | 5/2009 | Tiernan et al. |
| 7,560,289 B2 | 7/2009 | Hong et al. |
| 7,573,264 B2 | 8/2009 | Xu et al. |
| 7,573,268 B2 | 8/2009 | Volegov et al. |
| 7,598,897 B2 | 10/2009 | Kirichenko |
| 7,603,158 B2 | 10/2009 | Nachman et al. |
| 7,649,353 B2 | 1/2010 | Feiweier et al. |
| 7,671,587 B2 | 3/2010 | Penanen et al. |
| 7,688,069 B2 | 3/2010 | Kraus et al. |
| 7,728,748 B1 | 6/2010 | Kirichenko |
| 8,593,141 B1 | 11/2013 | Radparvar et al. |
| 2002/0087063 A1* | 7/2002 | Lou .................. 600/410 |
| 2004/0239319 A1 | 12/2004 | Tralshawala et al. |
| 2005/0234329 A1 | 10/2005 | Kraus |
| 2006/0186882 A1 | 8/2006 | Walsh |
| 2007/0085534 A1 | 4/2007 | Seki et al. |
| 2008/0119156 A1* | 5/2008 | Hotto .................. 455/280 |
| 2009/0136104 A1* | 5/2009 | Hajian et al. .................. 382/128 |
| 2009/0232510 A1* | 9/2009 | Gupta et al. .................. 398/136 |
| 2009/0315802 A1 | 12/2009 | Johansen et al. |
| 2011/0210728 A1* | 9/2011 | Somasundaram et al. .... 324/300 |

OTHER PUBLICATIONS

K K. Likharev and V. K. Semenov, "RSFQ Logic/Memory Family: A New Josephson-Junction Technology for Sub-Terahertz-Clock-Frequency Digital Systems", IEEE Transactions on Applied Superconductivity, vol. 1, No. 1, Mar. 1991 (pp. 3-28).

L. Darasse and J.C. Ginefri, "Perspectives with cryogenic RF probes in biomedical MRI", Biochimie, vol. 85, p. 915 (2003).

"Calculated SNR of MRI detected with SQUIDs and Faraday detectors", W. Myers, et al., Journal of Magnetic Resonance, vol. 186, p. 182 (2007).

Comparison of linear and circular polarization for magnetic resonance imaging G. H. Glover, C. E. Hayesa N. J. Pelc, W. A. Edelstein, O. M. Mueller, H. R. Hart, C. J. Hardy, M. O'Donnell and W. D. Barber, http://www.sciencedirect.com/science/article/pii/002223648590349X, Journal of Magnetic Resonance (1969), vol. 64, Issue 2, Sep. 1985, pp. 255-270.

Ultimate intrinsic signal-to-noise ratio in MRI, Ogan Ocali, Ergin Atalar, Magnetic Resonance in Medicine, vol. 39, Issue 3, pp. 462-473, Mar. 1998.

G. Kaiser, S. Linzen, H. Schneidewind, U. Hubner and P. Seidel, "First experimental investigations on a thin film Hall magnetometer with a high temperature superconducting pick-up antenna", Cryogenics 38 (1998) 625-629.

* cited by examiner

```
%Matlab program QuadMRI
t=0:99;%Time units
t1=2*pi*t/100;%Dimensionless time in radians
NoiseAmp=10;%Noise to signal ratio
Angle=pi/180*(60);%Noise vector angle in radians
Phi=pi/180*(40);%Signal phase shift in radians
Sig=cos(t1+Phi);%Signal in x-coil
SigQuad=sin(t1+Phi);%Signal in y-coil
NoiseSig=NoiseAmp*cos(t1);%Noise signal
Vx=cos(Angle)*NoiseSig+Sig;%X-coil signal+noise
Vy=sin(Angle)*NoiseSig+SigQuad;%Y-coil signal+noise
Root=sqrt(Vx.^2+Vy.^2);cosEst=abs(Vx)./Root;%First estimate of cos(Angle)
sinEst=abs(Vy)./Root;%First estimate of sin(Angle)
tanEst=Vy./Vx;%First estimate of tan(Angle)
tanAv=sum(tanEst)/100;%Average of tan(Angle)
cosAv=sum(cosEst)/100;%Average of cos(Angle)
sinAv=sum(sinEst)/100;%Average of sin(Angle)
sinAv=sinAv*sign(tanAv);%Sign correction for negative angles
thetaEst=acos(cosEst);%First estimate of Angle in radians
thetaAv=sum(thetaEst)/100*sign(tanAv);%Average of Angle in radians
SigEst=cosAv*Vy-sinAv*Vx;%Recovered signal
SigShift=sin(t1+Phi-Angle);%Ideal signal for comparison with recovered signal
plot(t,SigEst,t, SigShift,t,Vy);%Plot comparing the large noisy signal with recovered and ideal signals
```

Fig. 5

SYSTEM AND METHOD FOR NOISE REDUCTION IN MAGNETIC RESONANCE IMAGING

BACKGROUND OF THE INVENTION

Nuclear magnetic resonance (NMR) is associated with coherent resonant rotation of magnetic atomic nuclei, around an axis parallel to a large static applied magnetic field, following excitation by a radio-frequency pulse. The rotation frequency (the Larmor frequency) is proportional to the applied magnetic field, given by $f=\gamma\beta$, where $\gamma=42$ MHz/T for the hydrogen nucleus (proton) and of similar magnitude for other nuclei. The coherent decay time, known as $T_2$, is typically of order 100 ms, reflecting the very high-Q nuclear rotations with only weak interactions with the atomic environments. In magnetic resonance imaging (MRI), appropriate weak gradients in applied magnetic field are used to obtain frequency gradients, thus enabling Fourier transforms of the nuclear signal to be mapped onto spatial images. However, the coherent signal is extremely weak, corresponding to radio frequency (RF) magnetic fields (for 1-mm resolution) of order $10^{-14}$ T (=10 fT) in an applied field of order 1 T. For an applied field in the z-direction, the RF magnetic signal rotates in the x-y plane at the Larmor frequency, corresponding to circular polarization (see FIG. 1).

Magnetic resonance imaging (MRI) is primarily a medical imaging technique commonly used in radiology to visualize detailed internal structures and limited functions of the body, but also used in non-destructive testing and other fields. MRI is useful because it provides great contrast between the different soft tissues of the body, such as lipid and aqueous. MRI is discussed in detail at en.wikipedia.org/wiki/Magnetic_resonance_imaging (incorporated herein by reference).

In addition to the desired RF signal, the measured RF fields also comprise noise within the same frequency band. There may be many sources of noise, including noise associated with electrical currents in the antenna and amplifiers in the receiver. The dominant source of noise in MRI systems typically comprises fluctuating Johnson noise associated with thermally excited eddy currents in the electrically conducting medium of the human body or other object under examination. Johnson noise is the electrical noise generated by the thermal agitation of charge carriers, such as electrons and ions, inside an electrical conductor at equilibrium. Johnson noise is approximately white, meaning that its spectral density is nearly equal throughout the frequency spectrum, and therefore including even the relatively narrow bands of interest during MRI signal processing. See, for example, "Signal-to-noise ratio in MRI", T. W. Redpath, British Journal of Radiology, vol. 71, pp. 704-707 (1998), incorporated herein by reference. This Johnson noise is largely independent of the static magnetic field, while the signal of interest is proportional to the applied field. (This is the main impetus for the use of very large magnetic fields.) These eddy currents create broadband RF magnetic fields which also couple to the pickup coil or coils, with a form within a narrow band of interest that may be expressed as $B_n(t)=B_{n0}\cos(\omega t+\phi_n)$, where $B_{n0}$ and $\phi_n$ are the amplitude and phase of the fluctuating noise component of the magnetic field that couples to the coil. MRI receivers generally filter out all noise outside of the narrow band required for the MRI signal. For example, a typical receiver bandwidth might be 50 kHz or less. In this case, $B_{n0}$ and $\phi_n$ can vary significantly over a time greater than about 20 microseconds limited by the receiver bandwidth. Note that the nuclear signal itself is coherent for a time $T_2$ of order 100 ms, while the various noise sources are incoherent (or coherent over much shorter timescales), so that signal integration generally increases the signal amplitude linearly with the time, while it increases the noise amplitude with the square root of the time. The signal-to-noise ratio (SNR) thus increases with averaging or measurement repetition. However, performing an integration over the coherence time to maximize the signal to noise ratio may unduly prolong an MRI scan, which is uncomfortable to the patient, and may lead to movement artifacts during the scan.

There has been relatively little effort in the prior art devoted to measuring and characterizing the body noise in MRI. However, U.S. Pat. No. 6,865,494, expressly incorporated herein by reference, proposes to provide "noise tomography", in which a three dimensional scan of Johnson noise is itself the output, wherein tissues having different conductivity have variations in the measured noise.

One type of MRI antenna is described in by Eydelman in U.S. Pat. No. 6,636,040, incorporated herein by reference. Eydelman's antenna, and that of similar devices, reads both the signal, as well as noise from Eddy Currents caused by various dynamic magnetic fields in the body, including those induced by the MRI machine itself. The isolation of the signal with respect to in-band noise is difficult and often impossible, leading to impaired resolution or aberrations, longer scan time, and/or image noise.

Consider a planar pickup coil in the y-z plane, which detects a field component of the rotating nuclear magnetic signal $B_{sx}(t)=B_{s0}\cos(\omega t)$ in the x-direction, where $\omega=2\pi f$ is the Larmor frequency. An identical coil oriented in the x-z plane will detect the corresponding nuclear magnetic field component $B_{sy}(t)=B_{s0}\sin(\omega t)$ in the y-direction, shifted by 90° from the first coil. Taken together, the two coils form a quadrature antenna, which is known in the prior art. The prior art further teaches that applying a 90° phase shift and adding the signals from the two antennas will increase the nuclear magnetic signal amplitude by a factor of two. See, for example, U.S. Pat. No. 7,649,353; U.S. Pat. No. 4,769,605; U.S. Pat. No. 5,351,688.

If one has two antennas in a quadrature configuration, adding the two signals with a 90° phase shift increases the signal amplitude by a factor of two, as noted above. If the noise signals $B_a$ from the two antennas are uncorrelated, then adding the two signals increases the noise amplitude by a factor of the square root of two ($\sqrt{2}$). So the SNR would increase by $\sqrt{2}$, or about 3 dB in terms of power ratios. Such an improvement is significant but limited.

A further aspect of the prior art is the development of more sensitive low-noise receivers, including cryogenic coils, superconducting sensors (based on superconducting quantum interference devices or SQUIDs), and low-noise amplifiers. These may be useful when the signal of interest is especially weak, as for example in relatively low magnetic fields. See, for example, U.S. patent application Ser. No. 12/954,291, filed Nov. 24, 2010, expressly incorporated herein by reference in its entirety. See also, for example, U.S. Pat. No. 6,885,192; U.S. Pat. No. 7,053,610; U.S. Pat. No. 6,538,445; U.S. Pat. No. 5,276,398; see also L. Darasse and J. C. Ginefri, "Perspectives with cryogenic RF probes in biomedical MRI", Biochimie, vol. 85, p. 915 (2003) and "Calculated SNR of MRI detected with SQUIDs and Faraday detectors", W. Myers, et al., Journal of Magnetic Resonance, vol. 186, p. 182 (2007), incorporated herein by reference. However, in many cases the receiver noise is already less than the body noise, so that very little additional SNR is obtained from further reduction in receiver noise.

Superconducting quantum interference devices (SQUIDs) are very sensitive magnetometers used to measure extremely weak magnetic fields, such as those produced during MRI medical tests, based on superconducting loops containing Josephson junctions.

See, U.S. Pat. Nos. 7,688,069, 7,671,587, 7,603,158, 7,573,268, 7,573,264, 7,560,289, 7,535,228, 7,525,314, 5,586,064, 3,801,877, 7,521,928, 7,482,807, 7,474,095, 7,466,132, 7,395,107, 7,363,070, 7,248,044, 7,218,104, 7,197,352, 7,193,415, 7,187,169, 7,144,376, 7,130,675, 7,123,952, 7,092,748, 7,038,450, 6,897,654, 6,865,494, 6,697,660, 6,681,131, 6,544,170, 6,522,908, 6,477,398, 6,374,131, 6,370,414, 6,208,884, 6,187,032, 6,159,444, 6,150,809, 6,073,040, 6,031,373, 6,002,254, 5,982,174, 5,827,501, 5,771,894, 5,771,893, 5,755,227, 5,752,514, 5,682,889, 5,671,740, 5,657,756, 5,608,320, 5,601,081, 5,600,243, 5,594,849, 5,543,770, 5,495,849, 5,442,290, 5,426,365, 5,408,178, 5,384,109, 5,351,006, 5,339,811, 5,326,986, 5,325,854, 5,303,705, 5,274,331, 5,233,992, 5,208,534, 5,187,327, 5,057,776, 5,021,739, 4,951,674, 7,116,102, 7,053,610, 6,885,192, 6,724,188, 4,390,840, 4,442,404, 4,573,015, 4,588,947, 4,851,777, 4,864,237, 4,906,931, 4,987,368, 5,057,776, 5,208,533, 5,254,950, 5,300,887, 5,343,147, 5,557,199, 5,600,243, 5,835,995, 6,023,161, 6,031,373, 6,159,444, 6,544,170, 6,724,188, 4,879,516, 4,695,801, 7,126,333, 6,838,875, 5,436,564 and 2006/0186882, each of which is expressly incorporated herein by reference.

The prior art has not effectively solved the issue of noise in bioelectric and/or biomagnetic field measurements, such as the background body noise in MRI systems, so that one may obtain high-resolution images with ultra-sensitive receivers, without requiring the largest magnetic fields and long integration times.

SUMMARY OF THE INVENTION

The invention takes advantage of the observation that the body noise (or sample noise) in MRI has a substantially different physical profile than the nuclear signal of interest, and active real-time interference cancelation may thus be applied to reduce the effect of the noise. While the body noise is incoherent and changes quickly, if a real-time measurement of the body noise can be subtracted from the total signal, the signal of interest can be measured more accurately. The relevant distinctive physical properties of the body noise may be examined by considering an element of a transient electric current dipole that is believed to comprise much of the body noise. Such a current dipole is characterized by the following properties:

1) The electromagnetic field from such a current dipole is always linearly polarized, in contrast to the circularly polarized MRI signal of interest.
2) A short-pulse current dipole with pulse-width $\Delta t$ (~1 ns) corresponds to a power spectrum that is flat up to a cutoff frequency ~$1/\Delta t$, i.e., broadband white noise. This is quite different from the narrowband 100-ms coherent MRI signal of interest.
3) Such a current dipole may also be spatially localized differently from the MRI signal.

While a real system of interest may exhibit a large number of interfering noise signals from such current dipole sources at various positions, times, and directions, the principle of body noise cancelation may be illustrated by consideration of a single current dipole source at a time.

One embodiment of the invention focuses on the signal polarization, and provides an enhancement of a quadrature antenna configuration according to the prior art, but rather than simply combining the two signals with a 90° phase delay, it makes use of more sophisticated digital processing to combine the two signals in a way that substantially cancels the background noise. The fact that this may be possible has not been recognized in the prior art. This, for example, enables an enhancement of SNR by much more than the 3 dB predicted in the prior art. Other embodiments provide more complex antennas (e.g., with broader bandwidth) and antenna arrays, for example.

For simplicity, we assume that there is a single dominant noise source, corresponding to a linearly polarized magnetic field vector $B_n$, pointing in a direction $\theta$ relative to the x-axis, as shown in FIG. 1. (In general there would also be a component of $B_n$ pointing in the z-direction, but that is not detected by either coil, so it is ignored here.) In order to cancel the noise, it is important to determine this direction angle $\theta$, and track it as it changes in time.

The detected field components in the two coils in the x- and y-directions are:

$$B_x(t)=B_{sx}(t)+B_{nx}(t)=B_{s0}\cos(\omega t+\phi_s)+B_{n0}\cos(\theta)\cos(\omega t+\phi_n) \quad (1)$$

$$B_y(t)=B_{sy}(t)+B_{ny}(t)=B_{s0}\sin(\omega t+\phi_s)+B_{n0}\sin(\theta)\cos(\omega t+\phi_n) \quad (2)$$

where $\phi_s$ the phase shift of $B_s$, and $\phi_n$ is the phase shift of $B_n$. It is further assumed that while $B_s$, $\phi_s$, $B_n$, $\theta$, and $\phi_n$ may be functions of time within the bandwidth of the signal, they can be regarded as constants for short times of an RF period.

The useful information content for reconstructing the MRI image is contained within $B_{s0}$ and $\phi_s$. There are two equations with five unknowns for each value of t, but given multiple times, the system is fully determined. There may be many ways to solve for $B_{s0}$ and $\phi_s$.

In a preferred embodiment of the method, if we can estimate the angle $\theta$ (described further below), then we can cancel out the noise by multiplying the first signal by $\sin(\theta)$ and the second signal by $\cos(\theta)$, and taking the difference. Then we have:

$$B_y(t)\cos(\theta)-B_x(t)\sin(\theta)=B_{s0}[\sin(\omega t+\phi_s)\cos(\theta)-\cos(\omega t+\phi_s)\sin(\theta)]=B_{s0}\sin(\omega t+\phi_s-\theta) \quad (3)$$

Since we know $\theta$, we can then time-shift the result to obtain:

$$B_{sy}(t)=B_{s0}\sin(\omega t+\phi_s)=B_y(t+\theta/\omega)\cos(\theta)-B_x(t+\theta/\omega)\sin(\theta). \quad (4)$$

This permits cancellation of the noise, even if $B_{s0} \ll B_{n0}$. In fact, this is a preferred regime to focus on, since otherwise this algorithm has less applicability. In that limit, one can obtain a first crude estimate $\theta_{est}$ by neglecting $B_s$ in Eqs. (1) and (2):

$$\theta_{est}=\tan^{-1}(B_y/B_x) \quad (5)$$

Let us assume that $\theta$ lies in the range from $-\pi/2$ to $+\pi/2$. Then we have $$\cos(\theta_{est})=|B_x|/\sqrt{(B_x^2+B_y^2)}, \quad (6)$$

$$\sin(\theta_{est})=\tan(\theta_{est})\cos(\theta_{est})=sign(B_x)\times B_y/\sqrt{(B_x^2+B_y^2)}, \quad (7)$$

where $sign(B_x)$ provides the sign (positive or negative) of the field.

However, this estimate of $\theta$ is too crude; substituting these into Eqs. (3) yields the identity $B_{s0}=0$, thus cancelling out not only the noise but also the signal of interest.

Since $\theta$ is a constant over the timescales here, one can obtain a better estimate by taking an appropriate time-average $<\ldots>$. In order to obtain a reasonable diversity of input for the average, it is preferable to include a range of times covering a major fraction of a period. Taking the average of Eq. (5), one has:

$$\theta_{av} = \langle \tan^{-1}(B_y/B_x) \rangle. \quad (8)$$

Substituting Eqs. (8) into Eq. (4) leads to $$B_{sy}^{est}(t) = B_{s0}^{est} \sin(\omega t + \phi_s^{est}) = B_y(t+\theta_{est}/\omega)\cos(\theta_{av}) - B_x(t+\theta_{est}/\omega)\sin(\theta_{av}). \quad (9)$$

Alternatively, one may average $\cos(\theta_{est})$ and $\sin(\theta_{est})$ separately. Since these are nonlinear functions, the results may be slightly different.

This averaging does indeed lead to an improved estimate of the signal of interest, with most of the noise removed, even for the noise much larger than the signal, as shown in simulations described below.

For longer time-scales (approaching the coherence time $T_2$), one can use this algorithm to track $\theta(t)$, so that $B_s(t)$ and $\phi_s(t)$ may be extracted, and the imaging signals obtained from the Fourier transform.

A block diagram of a system employing the proposed polarized noise cancellation method is shown in FIG. 2. Here the angle $\theta(t)$ for a time-block of data is calculated digitally in a Digital Angle Calculator module, while the data in the two channels are stored or buffered in a Digital Time Delay module until Eq. (9) may be applied in the Digital Polarized Noise Canceller.

While this simple analysis has focused on instantaneous samples of the RF measurement signals $B_x$ and $B_y$, it is shown below that a similar algorithm may be applied to a downconverted intermediate frequency (IF) signal at a much lower frequency $f_I$. The only requirement is that $f_I \gg$ BW, the noise-limiting bandwidth of the receiver, so that $\theta$ should still be essentially constant over the range of times needed for the average.

In a preferred embodiment of the invention, various corresponding algorithms may be applied to digital samples of the RF or IF signal, using a fast digital processor such as a microprocessor, a dedicated digital signal processing (DSP) chip, or a field-programmable gate array (FPGA). The averages may be applied to sequential blocks of data, or to moving averages; in either case, appropriate memory buffers may be employed.

While the analysis above describes a noise signal that is linearly polarized, the same algorithm may also be applied if the noise signal has a more general elliptical polarization. The algorithm will tend to cancel out the primary axis of the noise, while leaving a reduced circularly polarized component that is more difficult to separate.

Likewise, in some cases, the "noise" itself may be useful, since its characteristics will vary spatially in dependence on characteristics of the medium and relationship of the antenna. The present algorithm can be used to separate this signal from other signals having different polarization characteristics.

In an alternative preferred embodiment of the invention, the receiver measures the RF signal over a much wider frequency band than that normally required for the MRI signal of interest (less than 100 kHz). For example, the RF signal may be highly oversampled with respect to the MRI signal of interest, with the large bandwidth preserved through the signal processing chain. This will, of course, increase the total noise entering the receiver, which is contrary to the conventional approach. However, let us assume the broadband body noise comprises a time-series of narrow pulses, caused by fast current dipoles, as shown in FIG. 3A. (These broadband noise pulses are quite distinct from the narrowband MRI excitation pulses.) Then these pulses can be detected and rejected from the signal using digital processing as shown schematically in FIG. 4, enabling the weaker narrow-band signal of interest to be measured more accurately. This can be accomplished, for example, by using a single pickup coil, which does not filter or and broaden the pulses.

These noise pulses may not all have the same amplitude, or polarity, or spectral characteristics, or emanate from the same location, and may even overlap to some degree, Practically, fast real-time processing may enable these to be identified and subtracted without requiring inordinate amounts of storage. Further pulse discrimination may be obtained using a plurality of pickup coils in different locations, each with its own digital receiver. Since the current dipoles may be localized, the relative pulse-heights may permit further correlation, enabling further noise cancelation.

This narrow pulse discrimination approach requires the use of a very broad-band, low-noise, fast receiver. Such a receiver may comprise digital superconducting components, such as a fast oversampled analog-to-digital converter based on rapid-single-flux-quantum (RSFQ) circuits. See, U.S. Pat. Nos. 7,365,663; 7,728,748; 6,608,581; 7,598,897; 5,140,324; 5,170,080; 5,198,815; 5,289,400, expressly incorporated herein by reference. See, also, K K. Likharev and V. K. Semenov, "RSFQ Logic/Memory Family: A New Josephson-Junction Technology For Sub-Terahertz-Clock-Frequency Digital Systems", IEEE Transactions on Applied Superconductivity, vol. 1, No. 1, Mar. 1991 (pp. 3-28). Preferred analog to digital converters have a sampling rate of at least 10 gigasamples per second for narrow pulse discrimination (body noise), high linearity, and high dynamic range.

The pulse discrimination noise reduction approach is complementary to the polarization noise reduction approach described above. In some cases, it may be appropriate to first apply the pulse discrimination approach to a broad-band signal, followed by a narrow-band filter, and subsequent application of the polarization algorithm.

It is therefore an object to provide a magnetic resonance imaging system, comprising: at least one receive antenna, oriented to sense a radio frequency field; said radio frequency field comprising a phase coherent narrowband oscillating signal of interest and a broadband interfering signal having at least one component within the narrow band of the signal of interest; a digital processor, configured to reduce an interference of the interfering signal with the signal of interest based on at least a time-correlated model of the interfering signal; and an output, configured to present the reduced interference signal of interest to an image processing unit.

The at least one antenna may comprise a plurality of antennas configured to determine a spatial characteristic of radio frequency fields, the digital processor being configured to at least partially distinguish between the signal of interest and the interfering signal based on different respective spatial characteristics. The at least one antenna may comprise a plurality of antenna elements configured in a two dimensional array, each element of the array having a different respective spatial sensitivity.

The interfering signal may comprise at least one pulse, and wherein the digital processor is configured to process a set of digital data representing the sensed radio frequency field in a time domain.

The digital processor may be configured to process a set of digital data representing the sensed radio frequency field in a frequency domain. The digital processor may be configured to correlate components of the interfering broadband signal within the narrow band with components of the broadband signal outside of the narrow band. The digital processor may be configured to process sequential time samples representing the radio frequency field, to estimate a waveform of the interfering signal, and to selectively digitally remove the estimated waveform of the interfering signal to produce the reduced interference signal.

According to one embodiment, the at least one antenna comprises at least two of the antennas which are oriented to sense a radio frequency field with different electromagnetic vector components; and the digital processor is configured to accept a time series representing a radio frequency field sensed by the at least two antennas, and to generate a digital output signal that increases a ratio of the signal of interest and noise comprising the interfering signal; further comprising an output processor configured to receive the output and to generate a spatial map corresponding to the output reduced interference signal.

The signal of interest may be substantially circularly polarized, and the interfering signal may be substantially linearly polarized. The at least one antenna may, in turn, comprise at least two antenna elements configured to have a differential response pattern to circularly polarized and linearly polarized radio frequency fields within the narrow band.

The at least one antenna may comprise at least two antennas configured to generate at least two quadrature-related magnetic resonance signals.

The digital processor may operate to reduce an interference of the interfering signal with the signal of interest within the narrowband by greater than about 3 dB. The digital processor may be configured to perform a nonlinear transformation on a representation of the radio frequency field. The digital processor may comprise a real-time pipelined processor.

The system may further comprise an analog-to-digital converter configured to directly oversample a signal representing the radio frequency field substantially without frequency translation. The analog-to-digital converter may sample at a multi-GHz rate, and thus produce digital outputs at a multi-gigasample per second rate. The system may further comprise an analog-to-digital converter configured to process a signal representing the radio frequency field after frequency translation.

Another object provides a magnetic resonance imaging method, comprising: sensing a radio frequency field with at least one antenna, the radio frequency field comprising a phase coherent narrowband oscillating signal of interest and a broadband interfering signal having at least one component within the narrow band of the signal of interest; digitally processing a signal representing the radio frequency field to selectively to reduce an interference of the interfering signal with the signal of interest, based on at least a time-correlated model of the interfering signal to produce a reduced interference signal; and outputting the reduced interference signal.

The signal of interest may be predominantly circularly polarized, and the interfering signal may comprise at least one linearly polarized component, the method further comprising: receiving at least two signals representing a respective vector sum of the signal of interest and the interfering signal, projected in at least two directions; and analyzing the at least two received signals, to separate out the signal of interest from the interfering signal based on a spatial difference therebetween.

The at least one antenna may comprise a plurality of antenna elements configured in a two dimensional array, each element of the array having a different respective spatial sensitivity. The at least one receive antenna may comprise at least two of the antennas which are oriented to sense a radio frequency field with different electromagnetic vector components; and the digitally processing may comprise processing a time series representing a radio frequency field sensed by the at least two antennas, and generating a digital output signal that increases a ratio of the signal of interest and noise comprising the interfering signal; the method further comprising generating a spatial map corresponding to the reduced interference signal.

The interfering signal may comprise at least one pulse, and wherein the digitally processing comprises processing a set of digital data representing the sensed radio frequency field in a time domain.

The digitally processing may comprise processing at a rate in excess of 2.5 gigasamples per second.

The digitally processing may comprise processing sequential time samples representing the radio frequency field, to estimate a waveform of the interfering signal, and selectively digitally removing the estimated waveform of the interfering signal to produce the reduced interference signal.

The signal of interest may be substantially circularly polarized, and the interfering signal may be substantially linearly polarized. The at least one antenna may comprise at least two antenna elements configured to have a differential response pattern to circularly polarized and linearly polarized radio frequency fields within the narrow band.

The method may further comprise directly oversampling a signal representing the radio frequency field substantially without frequency translation.

The digitally processing may comprise nonlinearly transforming a representation of the radio frequency field.

The method may comprise Fourier transforming the reduced interference signal, and generating a spatial map corresponding to the reduced interference signal.

The method may further comprise estimating a vector direction of the interfering signal by averaging data over a significant fraction of an oscillation period.

A further object comprises providing an imaging method, comprising: generating an atomic nucleus-orienting magnetic field; sensing outputs of at least one antenna comprising a signal corresponding to a precession of nuclei within the magnetic field in response to the generated magnetic field and an interfering component over time; digitally processing the sensed outputs in a manner sensitive to a time correlation of the signal corresponding to a precession of nuclei within the magnetic field and the interfering component over time, at a rate oversampled with respect to a Nyquist rate of the interfering component; and generating an image corresponding to a spatial origin of the signal corresponding to a precession of nuclei within the magnetic field with algorithmically reduced contribution of the interfering signal.

A still further object provides a method of enhancing detection of a signal of interest in a magnetic resonance imaging system, by selectively measuring or estimating at least one interference signal, and digitally subtracting in a time domain representation the measured or estimated interfering signal from a composite signal comprising the signal of interest and the at least one interference signal. The composite signal may be analyzed for at least one of differences in frequency distribution, time, spatial distribution, and polarization direction to distinguish the interference signal from the signal of interest.

BRIEF DESCRIPTION OF THE FIGURES

FIG. 5 shows the Matlab code for a preferred embodiment of the digital polarized noise cancellation method to cancel the noise component $B_n$.

DETAILED DESCRIPTION OF THE PREFERRED EMBODIMENTS

Figure 1:
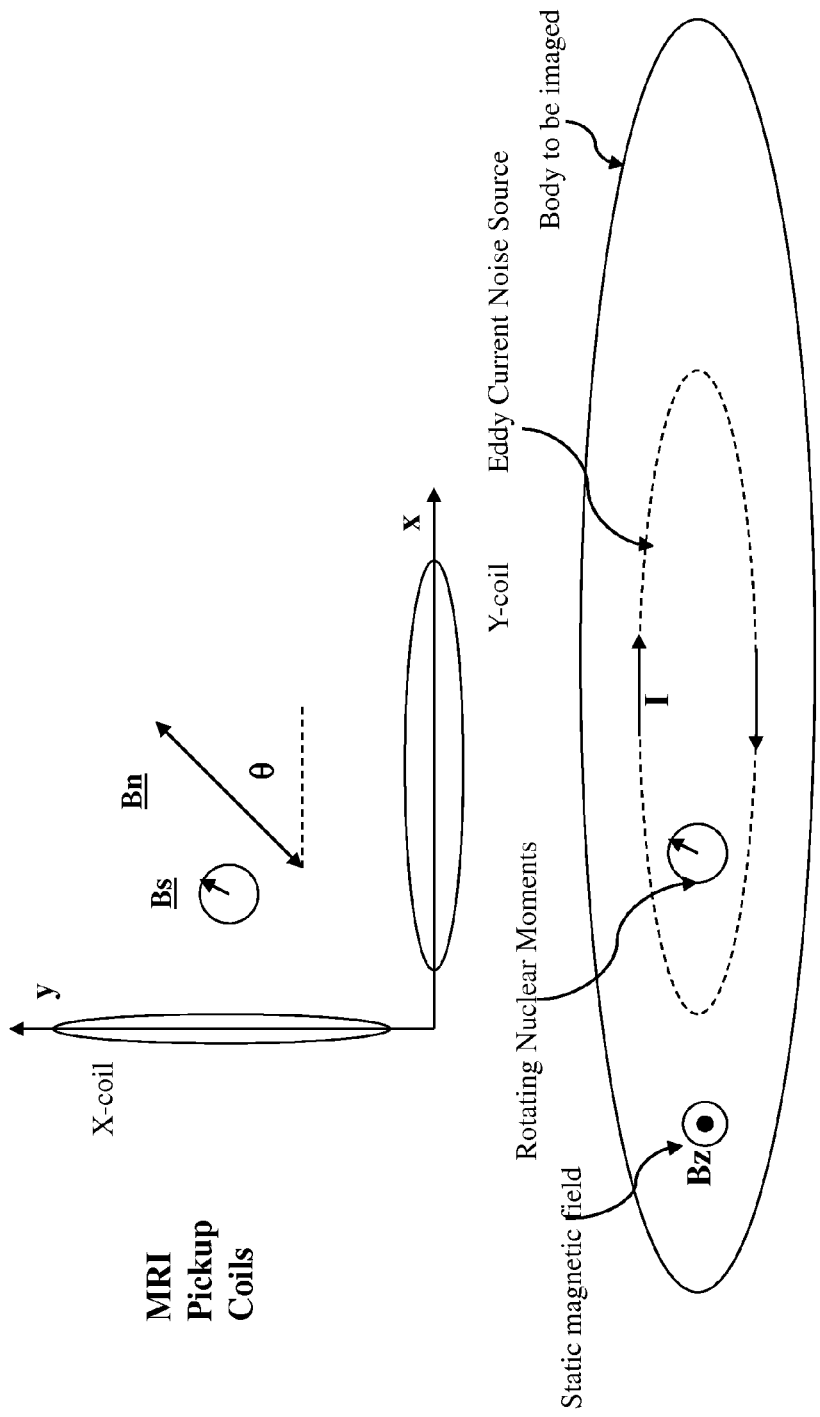
FIG. 1 shows the configuration of quadrature pickup coils and component magnetic fields of signal $B_s$ and noise $B_n$, where $B_s$ is circularly polarized and $B_n$ is linearly polarized.

In classic MRI, as shown in FIG. 1, a large static uniform magnetic field is applied in the z-direction, in order to polarize the magnetic nuclei in the object to be imaged (usually a part of a human body) along the z-axis. An RF transmit coil applies an RF field that causes the nuclei to rotate (precess) around the z-axis, generating RF magnetic fields that rotate in the x-y plane at the Larmor frequency. Small quasi-static magnetic field gradients are applied that shift this frequency slightly, depending on position. A coil placed near the body (the y-coil in FIG. 1) measures this narrow-band signal, which is subsequently amplified and Fourier-transformed to recover the positional information. In addition to the nuclear resonance signal, broadband fluctuating eddy currents in the body also produce RF magnetic fields in the pickup coil, but for a single current dipole noise source, these noise fields are linearly polarized rather than circularly polarized as for the nuclear magnetic fields. FIG. 1 shows a single eddy current loop, but in general there may be multiple loops that contribute to the noise magnetic field, which may be uncorrelated. The pickup coil and subsequent receiver are generally narrow-band in conventional MRI systems, and select only the components of noise that lie within the signal band of interest. This restriction is relaxed in systems employing embodiments of the invention.

While the prior art has developed arrays of coils that selectively detect different parts of the signal, one aspect of the present invention focuses on detecting and cancelling out the body noise. In one aspect of the invention, this is done using at least one additional coil, for which a perpendicular quadrature coil (the x-coil in FIG. 1) is a preferred embodiment. The analysis above indicated that the quadrature coil is identical to the main coil, but this need not be the case, and in fact, the coil must be carefully designed to best match the spatial dependence of the noise and signal fields, which fall off as one moves away from the body in the y-direction. So for example, one may preferably use a quadrature coil that is at a similar distance from the body as the primary coil (y-coil), with adjustments in area and scaling factor to match the signal amplitudes in the two coils. Alternatively, one or more additional quadrature coils can be used, at different locations. In this way, one may combine the outputs of the several coils to achieve the best noise cancellation.

The signals from the two quadrature coils can be combined in several ways. For example, the prior art has taught that one may add the outputs with a 90° ($\pi/2$ radian) delay, to enhance the signal. Taking Eqs. (1) and (2) above, $$B_x(t-\pi/2\omega))+B_y(t)=2B_{s0}\sin(\omega t+\theta_s)+B_{n0}[\cos(\theta)\sin(\omega t+\phi_n)+\sin(\theta)\cos(\omega t+\phi_n)]=2B_{s0}\sin(\omega t+\phi_s)+B_{n0}\sin(\omega t+\phi_n+\theta) \quad (11)$$

But this combination does not help to isolate the noise. Alternatively, one may subtract these same two components to cancel the signal:

$$B_x(t-\pi/2\omega)-B_y(t)=B_{n0}\sin(\omega t+\phi_n-\theta) \quad (12)$$

This permits one to determine directly the amplitude of the body noise, assuming only that the body noise is linearly polarized (LP) and that the receiver noise is negligible. Eq. (12) can also be used together with an estimate of the angle $\theta$ (as described above for Eqs. (8) and (9)) to subtract off the noise from either Eq. (1) or (2), as an alternative to applying Eq. (10).

Figure 3:
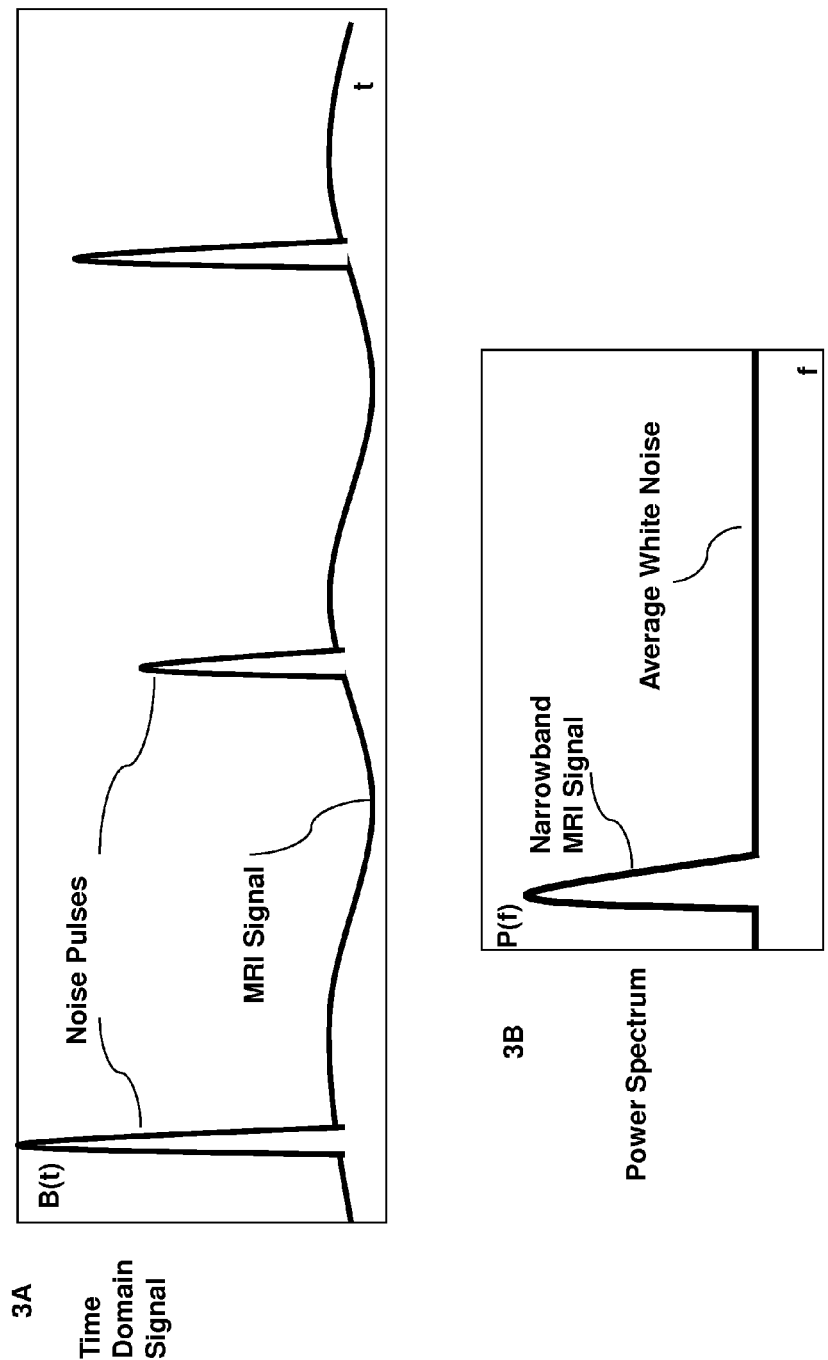
FIG. 3 shows a concept of a broadband signal from an MRI system comprising both a narrow-band MRI signal of interest and a larger series of interfering narrow pulses, in both the time domain (FIG. 3A) and the frequency domain (FIG. 3B).

The polarization of the signal in MRI is well known to be circularly polarized. However, the polarization of the noise in MRI does not seem to have been carefully investigated in the prior art. The body noise is believed to be due to one or more eddy currents in the lossy conducting body, and each such source creates a linear polarized (LP) magnetic field. The temporal profile of an eddy current in biological tissue is not well characterized, but may be modeled by a fast current pulse, as indicated in FIG. 3A. The orientation, location, amplitude, and phase of these thermally-activated currents will change with time. If there is a single dominant source (or correlated eddy currents over a large volume), then the noise is likely to be predominantly LP. Bandpass filtering would not be expected to alter the field polarization from such a body noise source.

The most general polarization from a superposition of multiple uncorrelated LP sources will be elliptically polarized (EP). Circular polarization (CP) is a special case of EP where there are two perpendicular components that are equal in magnitude and 90° out of phase. This is possible but generally unlikely for random fields. If the noise is CP at some time, then the method described here will not be effective at reducing this noise. However, more likely is the EP case where the amplitude along the major axis is several times larger than that along the minor axis. In this case as well, substantial reduction in noise is possible. However, a circularly polarized (CP) component of the noise will tend to group with the CP signal rather than with the LP noise in this method. Furthermore, there may also be CP random noise in the nuclear spins, although this is believed to be much smaller than the noise associated with the current dipoles.

While the invention has been illustrated for two antennas oriented in perpendicular directions, this can be easily extended to any other fixed angle $\beta$. In that case, the phase delay for the CP signal would be $\beta$, and the corresponding projections of the LP noise vector would be $\cos(\theta)$ and $\cos(\theta-\beta)$. Estimating these same factors would enable noise cancellation similarly to that shown in Eqs. (1-4). Furthermore, other algorithms may be employed that are based on distinguishing a coherent CP signal from a varying LP noise source.

Figure 2:
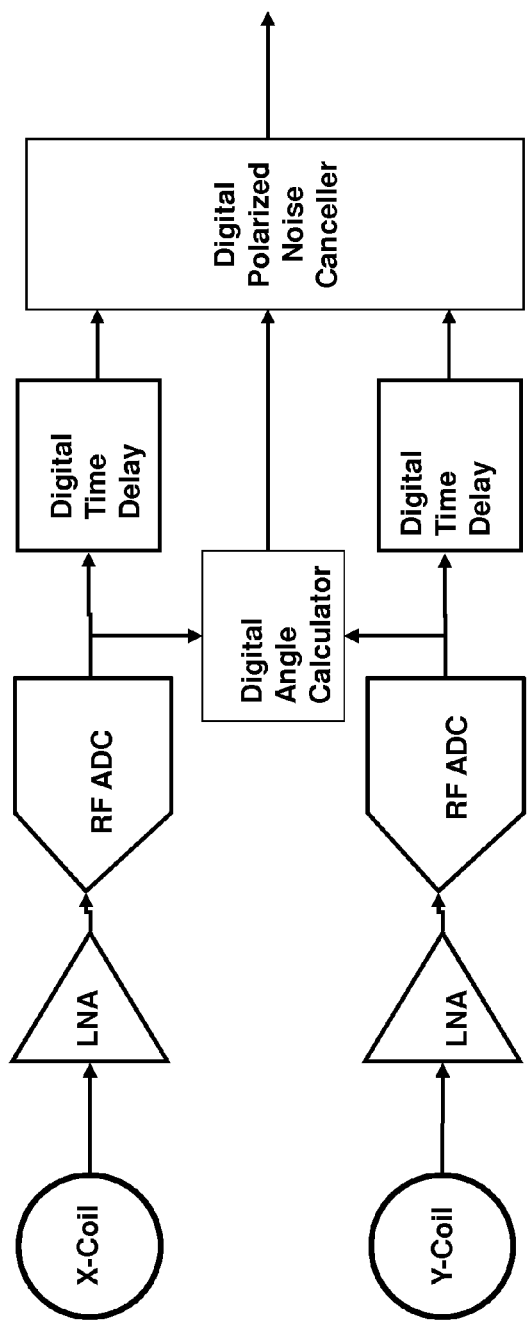
FIG. 2 shows a block diagram of a digital receiver system employing polarized noise cancellation.

FIG. 2 presents a simplified block diagram of a preferred system embodying the polarization noise reduction approach of an embodiment of the invention. This shows direct digitization of the RF signal from each of the quadrature coils, followed by a time-domain calculation of the direction $\theta$ of the polarized noise signal in a particular time-sequence of data from both channels. This value of $\theta$ is then used together with the same time-sequence of data in both channels to cancel the noise, for example as described in the equations above. The digital time-sequences of data are stored in an appropriate memory buffer, or otherwise delayed in a pipelined fashion. This digital time delay shown in FIG. 2 is distinct from a 90° phase delay as in quadrature receivers of the prior art. Furthermore the digital polarized noise canceller does not simply add the signals from the two channels. A full digital processor may be employed that comprises trigonometric functions and time-shifting, among other operations. These digital processing operations may be carried out in a general-purpose microprocessor operating, e.g., at room temperature, (if it is fast enough), or alternatively in a specialized programmable DSP chip, field-programmable gate array (FGPA), or other fast digital integrated circuit with memory buffers. Note also that for this technique to work properly, the noise contribution from the pickup coil, LNA, and digital receiver are preferably all small compared to the body noise. Otherwise, the noise correlations between the two channels will be reduced.

A conceptual picture that distinguishes the temporal nature of the MRI signal and broadband body noise is shown in FIGS. 3A and 3B. FIG. 3A shows this for an idealized broadband receiver in the time-domain. The equivalent time-averaged frequency dependent power spectrum is shown in FIG. 3B. Each narrow pulse in FIG. 3A represents the transient magnetic field from a thermally excited current dipole in the electrically conducting body. These dipoles die out very quickly (~1 ns) due to the lossy nature of ionic flow in the body, and represent a very low-Q system. The Fourier transform of a narrow pulse is a flat spectrum (white noise) up to a cutoff frequency that is of order the reciprocal of the pulsewidth (GHz range). In contrast, the rotating magnetic moments in the atomic nuclei are only very weakly coupled to the conducting medium, and represent a very high-Q system, as shown by the sinewave in FIG. 3A and the narrowband signal in FIG. 3B. This sharp contrast in physical properties has not been exploited in MRI systems of the prior art. Note that the narrowband filtering present in a conventional narrowband MRI receiver will broaden these narrow pulses in a way that may make them practically indistinguishable from the narrowband MRI signal.

Figure 4:
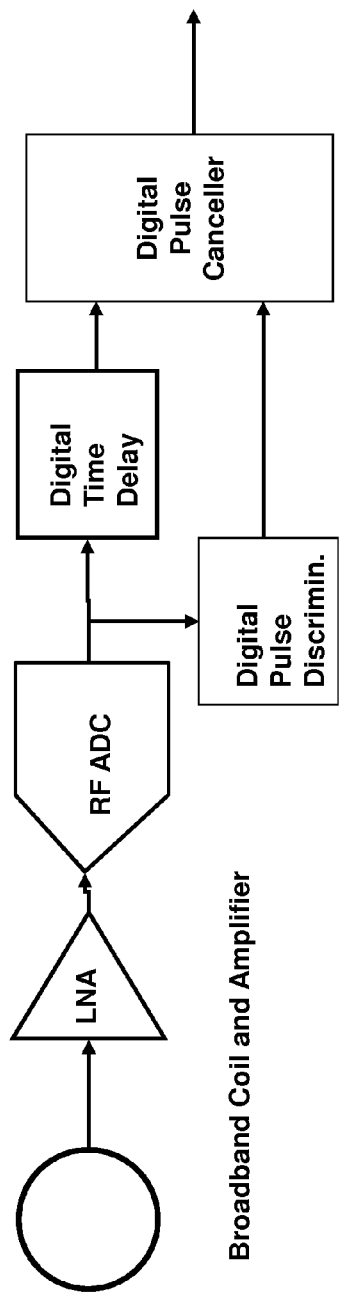
FIG. 4 shows a block diagram of a broadband digital receiver system employing digital noise pulse cancellation.

An alternative preferred embodiment of the invention, that enables detection and cancellation of the body noise narrow pulses, is shown in the block diagram of FIG. 4. Here we assume that the coil and low-noise amplifier (LNA) may be sufficiently broadband to permit discrimination of individual pulses in the time domain. A very broadband RF ADC (<10 MHz to >2.5 GHz) is used to digitize the entire signal, followed by a digital pulse discrimination circuit that identifies narrow pulses. A digital pulse cancellation module is then used to subtract off the narrow pulse and interpolate the background data, thus sharply reducing the body noise present in the signal. A model-based filter may also be employed to consolidate these processes. This signal can subsequently be digitally downconverted and filtered to obtain a digital baseband signal with a substantial increase in the useful MRI signal-to-noise ratio (SNR) that can be used either to increase imaging resolution or to speed up scans.

The average pulse frequency of the current dipole pulses has not clearly been identified, but will depend on the volume of the body that is coupled to the pickup coil. In general, smaller coils will receive less body noise, with a greater time delay between pulses. If the pulses are broadened or overlap substantially in time, the digital pulse cancellation approach may be unable to work effectively. For this reason, this method is likely to be most applicable for small coils, such as are used in MRI of small animals, or alternatively in human-scale systems comprised of an array of pickup coils. Such parallel arrays of small coils (e.g., a two-dimensional array of surface coils) have increasingly been used in the recent prior art as a method to enhance the scan rate and increase the effective SNR. Furthermore, conventional MRI systems typically use narrowband resonant pickup coils to minimize system noise; these might be modified to be compatible with the broadband noise signal discrimination system in this preferred embodiment of the invention.

Figure 6:
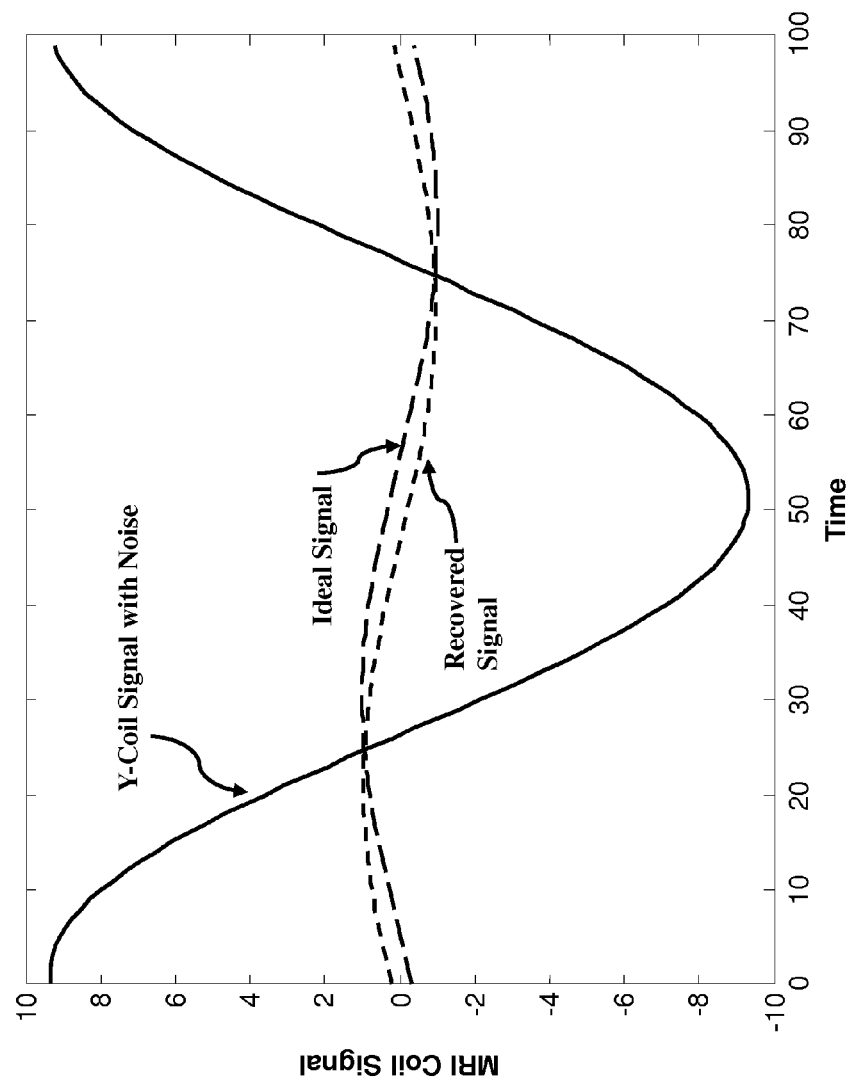
FIG. 6 shows the simulated time dependence of the noisy signal, recovered signal, and ideal signal according to a preferred embodiment of the method, with a linearly polarized noise signal, showing almost complete cancellation of the noise.

A Matlab program is provided which demonstrates the principle of the algorithm for polarized noise reduction, shown in FIG. 5. The program is simulated according to Eqs. (1)-(9), for a CP signal and LP noise, with two quadrature receiver coils labeled Vx and Vy. The time vector covers 100 steps in a single RF period, with t1 the normalized time vector in radians. In this example, the CP noise vector amplitude is 10 times larger than the signal amplitude (which is normalized to unity). The noise orientation angle is $\theta=60°$, its phase angle $\phi_n=0$, and the signal phase angle for the signal $\phi_s=40°$. FIG. 6 shows the time dependence of the received signal Vy, and also of the CP signal without the noise ("ideal signal"). It also shows the signal recovered from Vx and Vy, using the algorithm to estimate $\theta$. The recovered signal is similar in amplitude to the ideal CP signal, with a similar but not identical phase. This algorithm averages $\cos(\theta_{est})$ and $\sin(\theta_{est})$ separately over the 100 steps of the entire period, and works equally well for angles that are either positive or negative.

Figure 7:
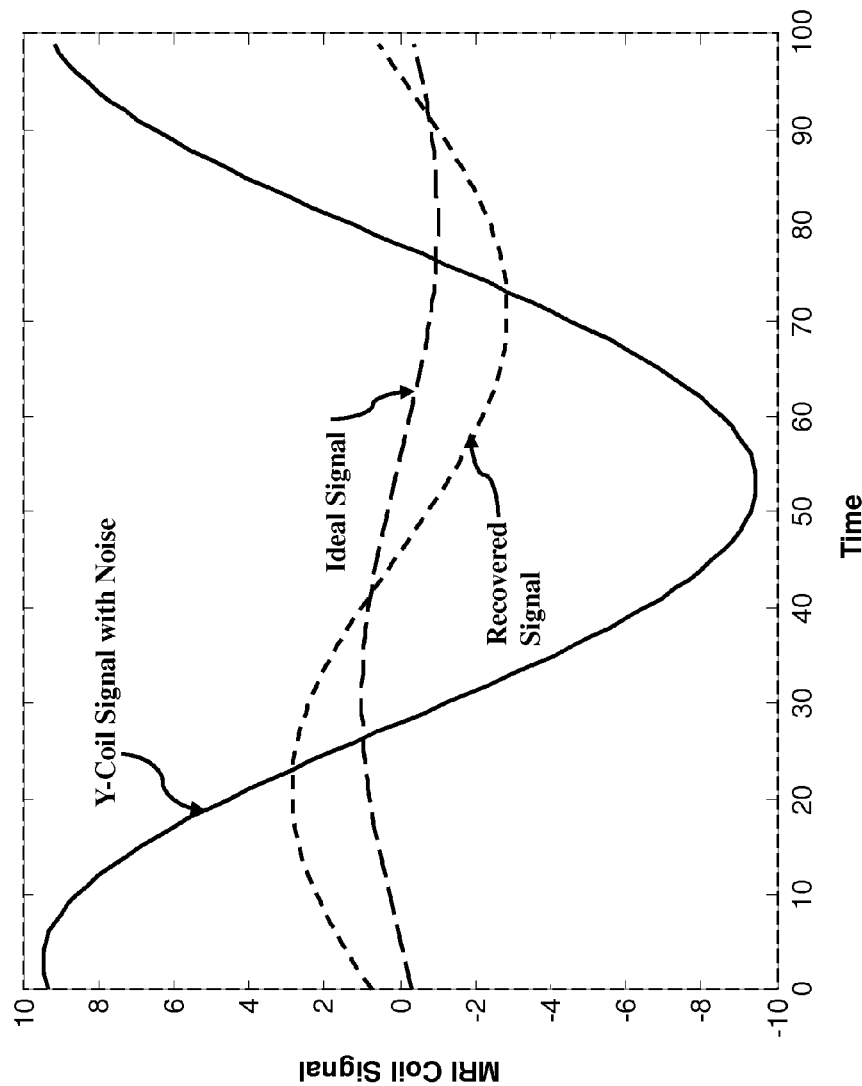
FIG. 7 shows the simulated time dependence of the noisy signal, recovered signal, and ideal signal, with an elliptically polarized noise signal, showing partial reduction of noise.

More generally, the body noise may be elliptically polarized (EP) rather than LP. For example, the simulation shown in FIG. 6 has been modified to include an EP noise signal, with an amplitude of 10 along the major axis at an angle $\theta=60°$ from the x-axis, and an amplitude of 2 along the minor axis perpendicular to this. This is essentially equivalent to a CP noise signal of amplitude 2 together with an LP noise signal of amplitude 8. The results of the EP-noise simulation are shown in FIG. 7. They indicate, as one might expect, that the algorithm succeeds in cancelling the LP portion of this noise, but the CP portion remains.

The analysis and algorithm described thus far have dealt with the case where the signals are sampled and averaged at the RF frequency, over a full period. In some cases, this would require digital sampling and computing at a very high frequency, which may be impractical. For example, if the RF frequency is 100 MHz, the direct sampling would require digital processing at multi-GHz rates. While this is possible with advanced digital processors (using, for example, ultrafast superconducting RSFQ circuits, see U.S. Pat. No. 7,443,719), such rapid processing may not be necessary. In most cases, the signals to the two receivers are both narrowband, with a typical bandwidth that may be BW=50 kHz or less. The amplitude and phase of the signals cannot change significantly over a time of order ½πBW~3 µs, much greater than the RF period of 10 ns. So any sub-sampling (with a fast sample-and-hold circuit) that samples the signal at a diversity of points within its cycle would also be effective, provided only that the samples included in the average are within the bandwidth-time. This makes the algorithm more readily achievable using real-time computation.

Alternatively, any downconversion technique that retains both the amplitude and phase factors would enable application of the present algorithm at lower speeds, provided that there are sufficient samples over a downconverted period for an appropriate average. That is, envelope detection alone is not enough, but this combined with coherent phase detection would be sufficient. Most MRI receivers use an analog heterodyne receiver with an ADC digitizing the IF output. Such an output would be sufficient for application of the preferred polarized noise reduction algorithm of the present invention, provided that it oversamples the BW by a sufficient factor (e.g., at least about 10) to obtain a diversity of points for the average.

In a practical implementation of the invention, the noise reduction algorithm may be applied to real-time data from the receive antennas, with a pipelined memory buffer to permit active tracking of the noise field direction and real-time correction of the signal, with only a small time-delay. Such an algorithm may be programmed in a fast microprocessor, or alternatively in a custom integrated circuit such as a field-programmable gate array (FPGA). The linearity and dynamic range of the ADC should be compatible with both the weak signal of interest and the strong noise, and the digital circuit should have enough bits for both. The system may be implemented within known computers or automated data processing systems consistent with the requirements herein. The program code for instructing a programmable processor may be stored on or in various computer readable media, or be integral with the design of the processor.

Noise reduction is important in MRI, because a good signal to noise ratio (SNR) can be used either to improve the ultimate spatial resolution, or to speed up the imaging time. Increasing the static magnetic field increases the SNR by increasing the signal magnitude, but it may cause other problems. For example, very large magnets require new systems with extreme homogeneity, and tend to be quite expensive. An alternative strategy is to increase the SNR by decreasing the noise, and decreasing the background body noise is one way to achieve this. The approach of the present invention can be applied to conventional MRI systems, without major modifications in hardware or data processing (although a broader bandwidth receiver may be necessary in some cases). Likewise, other biological signal processing systems may benefit from this technique, which can distinguish signal sources with different polarization and temporal characteristics through use of a plurality of antennas or a complex antenna to detect the signal source characteristics. A module incorporating a noise-reduction algorithm could accept the downconverted quadrature pair signals, and produce an output which goes to a conventional image generating processor that typically uses fast-Fourier transforms to generate spatial information.

An alternative approach is to make use of systems with low- and ultra-low-magnetic fields. These have generally been considered impractical, because the signal is weaker and thus the SNR is too small for a fast, high-resolution image. There has been progress recently in the development of low-noise coils and receivers, in some cases involving cryogenic temperatures. However, the success of this approach may be limited by the body noise, which in practical situations may limit the SNR even if the receiver noise is reduced. In such a regime, the use of digital noise reduction techniques as described in the present application to reduce the body noise will be particularly valuable.

This noise-reduction method may not be limited to magnetic resonance imaging. It may also apply in other situations where one is trying to detect a weak circularly polarized signal field in the presence of a stronger linearly polarized noise field, or where a narrowband signal is dominated by noise from broadband pulses. This may be the case, for example, in spectroscopy for nuclear magnetic resonance or nuclear quadrupole resonance. It may also be relevant for certain communications or radar protocols, where the transmitted signal may be circularly polarized.

What is claimed is:

1. A magnetic resonance imaging system, comprising:
   at least one receive antenna, oriented to sense a radio frequency field from an emission region;
   said radio frequency field comprising a superposition of a narrowband oscillating signal of interest from the emission region which is phase coherent over a time period, and a broadband interfering signal from the emission region which is not phase coherent over the time period, having at least one component which overlaps a frequency range of the narrowband oscillating signal of interest;
   a digital processor, configured to reduce an interference of the superposed broadband interfering signal with the narrowband oscillating signal of interest based on at least a time-correlated model of the interfering signal analyzing at least phase coherency; and
   an output, configured to present the signal of interest having reduced interference to an image processing unit,
   wherein at least one of:
   the signal of interest is at least partially circularly polarized, the interfering signal is at least partially linearly polarized, and the at least one antenna comprises at least two antenna elements configured to have a differential response pattern to circularly polarized and linearly polarized radio frequency fields within the narrow band;
   the signal of interest is predominantly circularly polarized, and the at least one interfering signal comprises at least one linearly polarized component, the digital processor being configured to receive at least two signals representing a respective vector sum of the signal of interest and the interfering signal, projected in at least two directions; and to analyze the at least two received signals, to separate out the signal of interest from the at least one interfering signal based on a spatial difference therebetween; and
   the digital processor is further configured to estimate a vector direction of the at least one interfering signal by averaging data over a significant fraction of an oscillation period of the oscillating signal of interest.

2. The system according to claim 1, wherein the at least one antenna comprises a plurality of antennas configured to determine a spatial characteristic of radio frequency fields, the digital processor being configured to at least partially distinguish between the signal of interest and the interfering signal based on different respective spatial characteristics.

3. The system according to claim 1, wherein the at least one antenna comprises a plurality of antenna elements configured in a two dimensional array, each element of the array having a different respective spatial sensitivity.

4. The system according to claim 1, wherein the interfering signal comprises at least one pulse, and wherein the digital processor is configured to process a set of digital data representing the sensed radio frequency field in a time domain.

5. The system according to claim 1, wherein the digital processor is configured to process a set of digital data representing the sensed radio frequency field in a frequency domain.

6. The system according to claim 1, wherein the digital processor is configured to correlate components of the interfering broadband signal within the narrow band with components of the broadband signal outside of the narrow band.

7. The system according to claim 1, wherein the digital processor is configured to process sequential time samples representing the radio frequency field, to estimate a waveform of the interfering signal, and to selectively digitally remove the estimated waveform of the interfering signal to produce the interference signal having reduced interference.

8. The system according to claim 1, wherein:
the at least one antenna comprises at least two of the antennas which are oriented to sense a radio frequency field with different electromagnetic vector components; and
the digital processor is configured to accept a time series representing a radio frequency field sensed by the at least two antennas, and to generate a digital output signal that increases a ratio of the signal of interest and noise comprising the interfering signal;
further comprising an output processor configured to receive the output and to generate a spatial map corresponding to the output signal of interest having reduced interference.

9. The system according to claim 1, wherein the signal of interest is at least partially circularly polarized, the interfering signal is at least partially linearly polarized, and the at least one antenna comprises at least two antenna elements configured to have a differential response pattern to circularly polarized and linearly polarized radio frequency fields within the narrow band.

10. The system according to claim 1, where the at least one antenna comprises at least two antennas configured to generate at least two quadrature-related magnetic resonance signals.

11. The system according to claim 1, wherein the digital processor reduces an interference of the interfering signal with the signal of interest within the narrowband by greater than 3 dB.

12. The system according to claim 1, further comprising an analog-to-digital converter configured to directly oversample a signal representing the radio frequency field without frequency translation.

13. The system according to claim 12, wherein the analog-to-digital converter samples at a multi-GHz rate.

14. The system according to claim 1, further comprising an analog-to-digital converter configured to process a signal representing the radio frequency field after frequency translation.

15. The system according to claim 1, wherein the digital processor is configured to perform a nonlinear transformation on a representation of the radio frequency field.

16. The system according to claim 1, wherein the digital processor comprises a real-time pipelined processor.

17. A magnetic resonance imaging method, comprising:
sensing a radio frequency field with at least one antenna, the radio frequency field comprising a superposition of a narrowband oscillating signal of interest from a spatial region which is phase coherent over a time period and at least one emitted broadband interfering signal from a region of space overlapping the spatial region which is not phase coherent over the time period, having at least one component within the narrow band of the signal of interest;
digitally processing a signal representing the radio frequency field, to selectively to reduce an interference of the at least one superposed interfering signal with the signal of interest, based on at least a time-correlated model of a source of the at least one interfering signal, to produce a signal having reduced interference; and
at least one of:
(a) the signal of interest is predominantly circularly polarized, and the at least one interfering signal comprises at least one linearly polarized component, further comprising: receiving at least two signals representing a respective vector sum of the signal of interest and the at least one interfering signal, projected in at least two directions; and analyzing the at least two received signals, to separate out the signal of interest from the at least one interfering signal based on a spatial difference therebetween;
(b) the signal of interest is at least partially circularly polarized, the at least one interfering signal is at least partially linearly polarized, and the at least one antenna comprises at least two antenna elements configured to have a differential response pattern to circularly polarized and linearly polarized radio frequency fields within the narrow band; and
(c) estimating a vector direction of the at least one interfering signal by averaging data over a significant fraction of an oscillation period of the oscillating signal of interest.

18. The method according to claim 17, wherein the signal of interest is predominantly circularly polarized, and the at least one interfering signal comprises at least one linearly polarized component, further comprising:
receiving at least two signals representing a respective vector sum of the signal of interest and the at least one interfering signal, projected in at least two directions; and
analyzing the at least two received signals, to separate out the signal of interest from the at least one interfering signal based on a spatial difference therebetween.

19. The method according to claim 17, wherein the at least one antenna comprises a plurality of antenna elements configured in a two dimensional array, each element of the array having a different respective spatial sensitivity.

20. The method according to claim 17, wherein the at least one interfering signal comprises at least one pulse, and wherein the digitally processing comprises processing a set of digital data representing the sensed radio frequency field in a time domain.

21. The method according to claim 17, wherein said digitally processing comprises processing at a rate in excess of 2.5 gigasamples per second.

22. The method according to claim 17, wherein said digitally processing comprises processing sequential time samples representing the radio frequency field, to estimate a waveform of the interfering signal, and selectively digitally removing the estimated waveform of the interfering signal to produce the signal having reduced interference.

23. The method according to claim 17, wherein:
the at least one receive antenna comprises at least two of the antennas which are oriented to sense a radio frequency field with different electromagnetic vector components; and
said digitally processing comprises processing a time series representing a radio frequency field sensed by the at least two antennas, and generating a digital output signal that increases a ratio of the signal of interest and noise comprising the at least one interfering signal;
further comprising generating a spatial map corresponding to the signal having reduced interference.

24. The method according to claim 17, wherein the signal of interest is at least partially circularly polarized, the at least one interfering signal is at least partially linearly polarized, and the at least one antenna comprises at least two antenna elements configured to have a differential response pattern to circularly polarized and linearly polarized radio frequency fields within the narrow band.

25. The method according to claim 17, further comprising directly oversampling a signal representing the radio frequency field without frequency translation.

26. The method according to claim 17, wherein said digitally processing comprises nonlinearly transforming a representation of the radio frequency field.

27. The method according to claim 17, further comprising Fourier transforming the signal having reduced interference, and generating a spatial map corresponding to the signal having reduced interference.

28. The method according to claim 17, wherein the method further comprises estimating a vector direction of the at least one interfering signal by averaging data over a significant fraction of an oscillation period.

29. An imaging method, comprising:
generating an atomic nucleus-orienting magnetic field;
sensing outputs of at least one antenna comprising a signal corresponding to a precession of nuclei within the magnetic field in a spatial region in response to the generated magnetic field and an interfering component associated with the magnetic field emitted from the spatial region over time;
wherein the signal corresponding to a precession of nuclei within the magnetic field is at least partially circularly polarized, and the interfering component comprises at least one partially linearly polarized component;
digitally processing the sensed outputs in a manner sensitive to a time correlation of the signal corresponding to a precession of nuclei within the magnetic field and the superposed interfering component over time, at a rate oversampled with respect to a Nyquist rate of the interfering component; and
generating an image corresponding to a spatial origin of the signal corresponding to a precession of nuclei within the magnetic field with algorithmically reduced contribution of the interfering signal;
further comprising at least one of:
receiving at least two signals representing a respective vector sum of the signal corresponding to a precession of nuclei within the magnetic field and the interfering component, projected in at least two directions; said digitally processing comprising analyzing the at least two received signals, to separate out the signal corresponding to a precession of nuclei within the magnetic field from the interfering component based on a spatial difference therebetween;
the at least one antenna comprises at least two antenna elements configured to have a differential response pattern to circularly polarized and linearly polarized radio frequency fields within the narrow band; and
said digitally processing comprises estimating a vector direction of the at least one interfering component by averaging data over a significant fraction of an oscillation period of the signal corresponding to a precession of nuclei within the magnetic field.

30. A method of enhancing detection of a signal of interest from a region of interest with respect to at least one interfering signal from the region of interest, in a magnetic resonance imaging system, the signal of interest and the at least one interfering signal each having different magnetic field vector characteristics, comprising:
selectively measuring a superposed signal representing a composite of the signal of interest and at least one interfering signal, from each of at least two antennas proximate to the region of interest to capture information relating to magnetic field vector characteristics of the superposed signal;
employing a time correlated model of at least the at least one interfering signal to analyze the superposed signal with respect to the magnetic field characteristics; and
digitally subtracting, in a time domain representation, a representation of the at least one interfering signal from the composite of the signal of interest and the at least one interference signal, based on at least the time correlated model; and
at least one of:
(a) the signal of interest is predominantly circularly polarized, and the at least one interfering signal comprises at least one linearly polarized component, further comprising: receiving at least two signals representing a respective vector sum of the signal of interest and the at least one interfering signal, projected in at least two directions; and analyzing the at least two received signals, to separate out the signal of interest from the at least one interfering signal based on a spatial difference therebetween;
(b) the signal of interest is at least partially circularly polarized, the at least one interfering signal is at least partially linearly polarized, and the at least one antenna comprises at least two antenna elements configured to have a differential response pattern to circularly polarized and linearly polarized radio frequency fields within the narrow band; and
(c) estimating a vector direction of the at least one interfering signal by averaging data over a significant fraction of an oscillation period of the signal of interest.

31. The method according to claim 30, further comprising analyzing the composite of the signal of interest and at least one interfering signal for at least one of differences in frequency distribution, time, spatial distribution, and polarization direction to distinguish the interference signal from the signal of interest.

* * * * *